United States Patent [19]
Yee et al.

[11] Patent Number: 5,323,406
[45] Date of Patent: Jun. 21, 1994

[54] PHOTONIC MIXER FOR PHOTONICALLY MULTIPLYING TWO ELECTRICAL SIGNALS IN TWO OPTICALLY INTERCONNECTED INTERFEROMETRIC MODULATORS OPERATED AT MODULATION OUTSIDE THE LINEAR RANGE

[76] Inventors: Ting K. Yee, 348 Dolphin Isle, Foster City, Calif. 94404; James F. Coward, 1612 English Dr., San Jose, Calif. 95129; Peter H. Chang, 1232 Domington Dr., San Jose, Calif. 95129

[21] Appl. No.: 970,752

[22] Filed: Nov. 2, 1992

[51] Int. Cl.$^5$ ............................... H01S 3/13
[52] U.S. Cl. ............................. 372/26; 385/2; 385/3
[58] Field of Search ................ 372/26; 385/1–3, 385/14

[56] References Cited

U.S. PATENT DOCUMENTS

| | | | |
|---|---|---|---|
| 5,004,314 | 4/1991 | Booth et al. | 385/2 |
| 5,040,865 | 8/1991 | Chen et al. | 385/2 |
| 5,109,441 | 4/1992 | Glaab | 385/1 |
| 5,119,447 | 6/1992 | Trisno | 385/3 |
| 5,148,503 | 9/1992 | Skeie | 385/3 |
| 5,161,206 | 11/1992 | Djupsjöbacka | 385/2 |
| 5,199,086 | 3/1993 | Johnson et al. | 385/2 |

*Primary Examiner*—John D. Lee
*Attorney, Agent, or Firm*—John J. Morrissey; Donald C. Feix

[57] ABSTRACT

A Mach-Zehnder modulator (MZM), which divides a CW laser beam into two optical portions, is biased at a 180° phase difference between the two optical portions. An RF signal and an LO signal are simultaneously applied to one of the optical portions of the laser beam to produce phase changes between the two optical portions. The two optical portions of the laser beam are then recombined into an optical output beam, which is detected by a photodetector. The photodetector generates a photocurrent, which contains a component at a beat frequency—i.e., the frequency difference between the RF and LO frequencies. The waveform of the photocurrent component at the beat frequency is substantially the same (except for amplitude and a fixed phase shift) as the waveform of the RF signal.

7 Claims, 4 Drawing Sheets

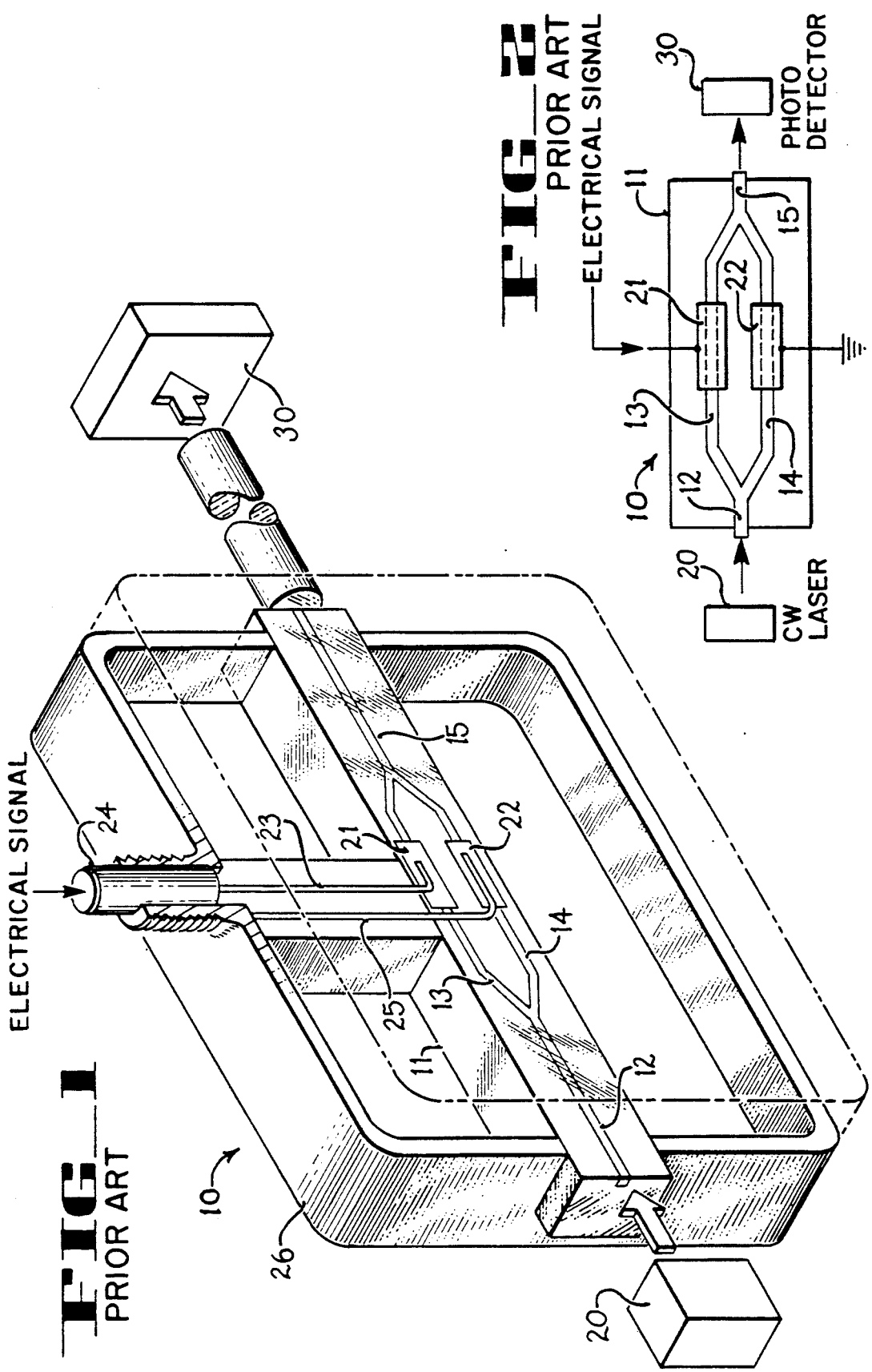

FIG_3
PRIOR ART
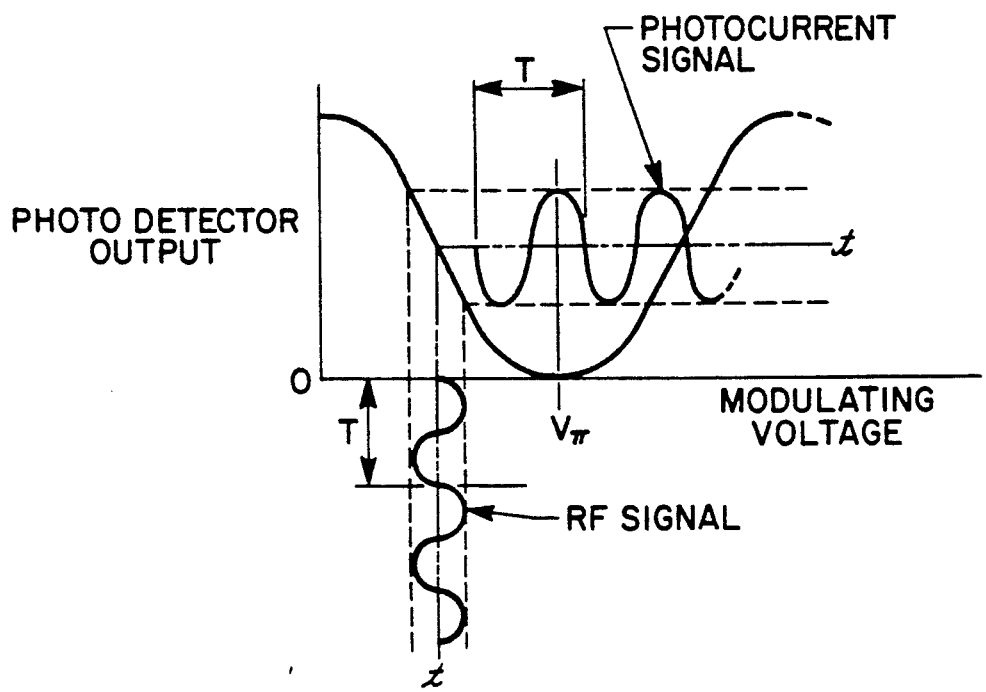
FIG_4
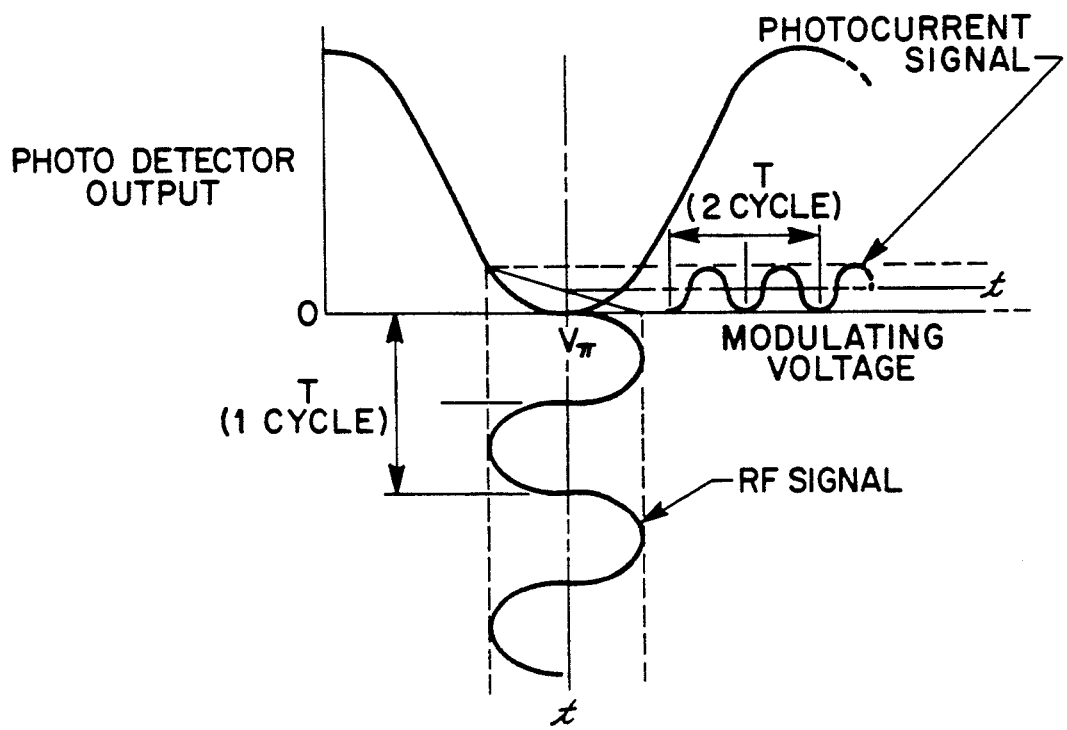

FIG_5
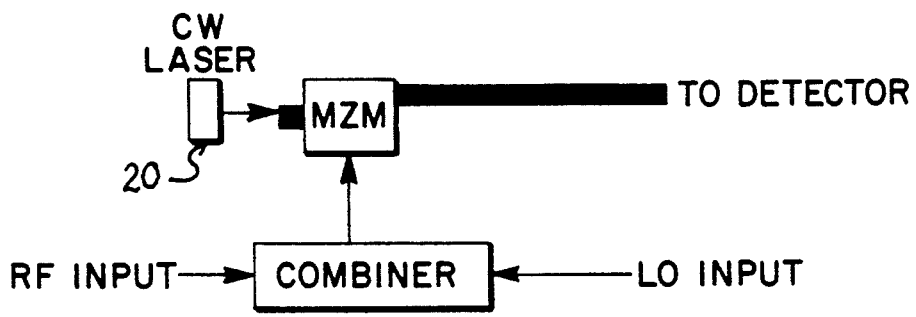
FIG_6
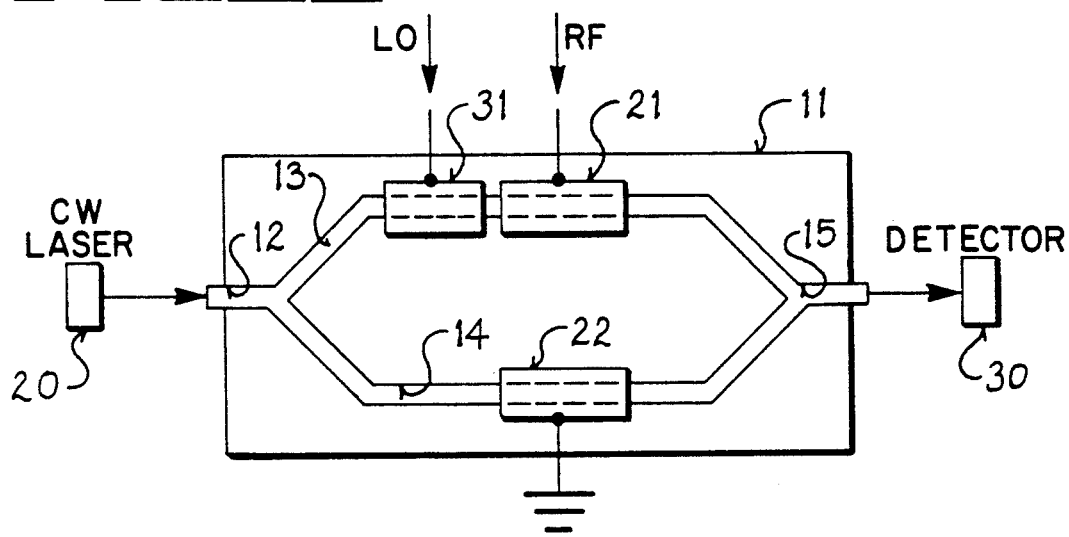
FIG_7
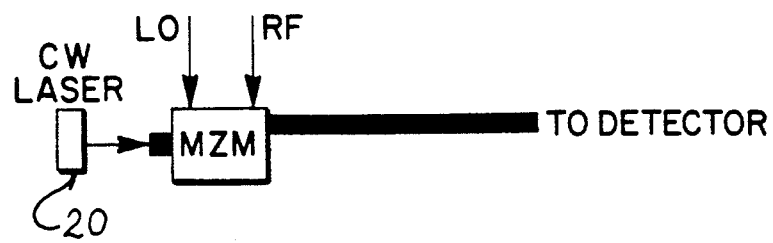

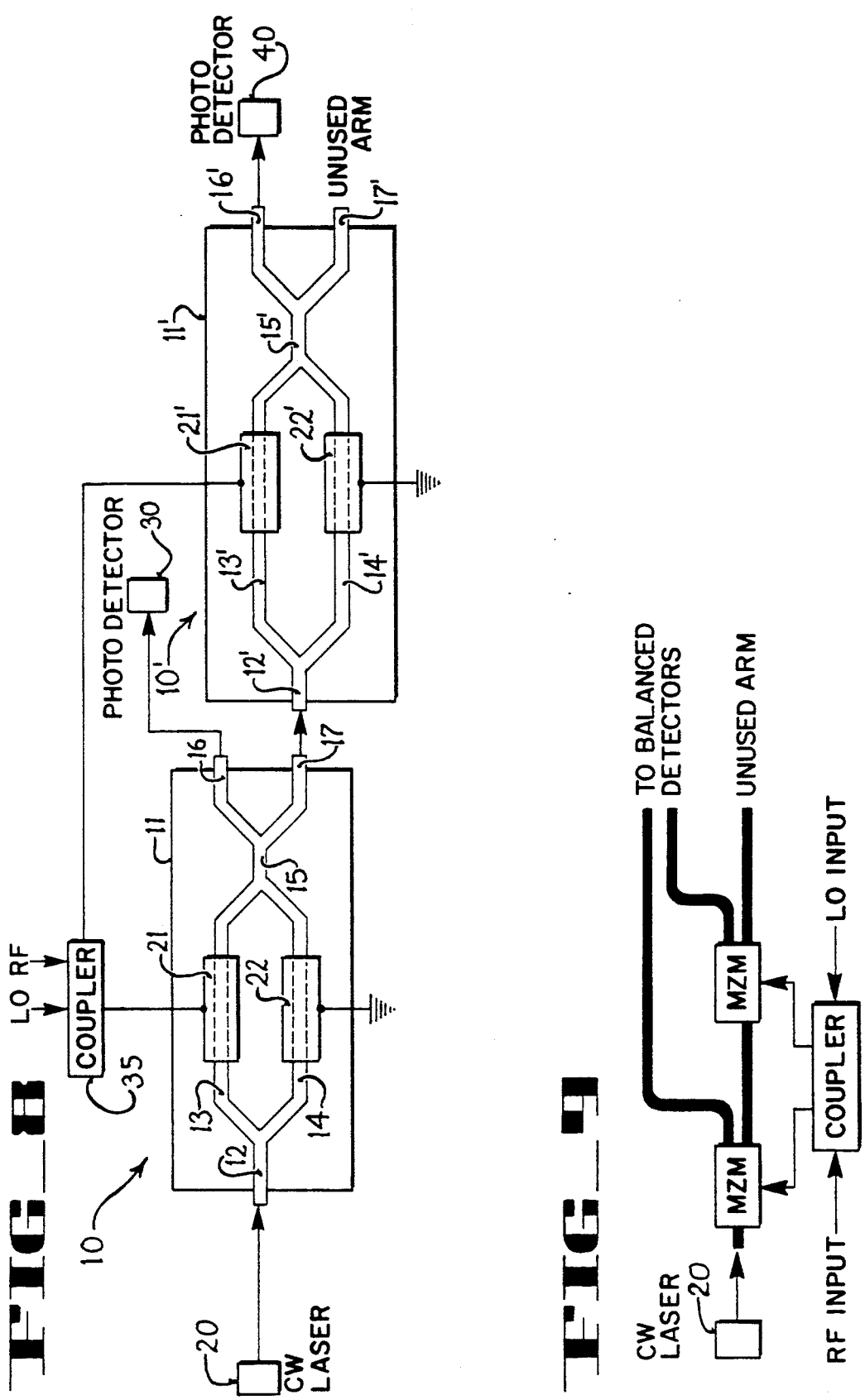

PHOTONIC MIXER FOR PHOTONICALLY MULTIPLYING TWO ELECTRICAL SIGNALS IN TWO OPTICALLY INTERCONNECTED INTERFEROMETRIC MODULATORS OPERATED AT MODULATION OUTSIDE THE LINEAR RANGE

TECHNICAL FIELD

This invention relates generally to electrical signal mixing, and more particularly provides a technique for photonically mixing electrical signals by means of a Mach-Zehnder modulator.

BACKGROUND ART

A Mach-Zehnder modulator (MZM) conventionally functions as a "high-fidelity" electrical-to-optical modulator—i.e., as a device for converting electrical signals to optical signals. Ordinarily, an MZM is operated at a bias so that an input voltage signal applied to the MZM modulates the amplitude of a continuous wave (CW) laser beam passing through the MZM. The amplitude-modulated laser beam is then detected by a photodetector, which produces a "high-fidelity" photocurrent signal (i.e., an electrical current output signal) that is substantially distortionless with respect to the input voltage signal.

The input voltage signal applied to the MZM to modulate the amplitude of the CW laser beam is typically a radiofrequency (RF) signal. The output signal from the photodetector (i.e., the photocurrent signal) is said to be distortionless with respect to the RF input signal—i.e., the MZM functions as a "high-fidelity" electrical-to-optical modulator—when the waveform of the photocurrent signal is the same as the waveform of the RF input signal. High-fidelity operation of the MZM is achieved by biasing the MZM to operate in a linear range in which the photocurrent signal varies substantially linearly with respect to the RF input signal.

It had not been recognized in the prior art that an MZM (or any other type of interferometric modulator) operating outside the linear range would have practical utility. Specifically, it was not realized in the prior art that an interferometric modulator such as an MZM operating outside the linear range could be used to advantage for photonically mixing electrical signals.

SUMMARY OF THE INVENTION

It is a general object of the present invention to provide a technique for photonically mixing electrical signals.

It is a particular object of the present invention to provide a technique for photonically mixing an information-bearing RF signal with a local oscillator (LO) signal of specified frequency by means of an interferometric modulator such as a Mach-Zehnder modulator (MZM) operating outside the linear range.

In accordance with the present invention, a CW laser beam is guided into an input section of a channel waveguide in an MZM. The channel waveguide branches into a first arm and a second arm, which rejoin inside the MZM to form an output section of the channel waveguide. The CW laser beam propagating through the waveguide splits so that corresponding portions of the laser beam are propagated through the first and second arms, and then recombine in the output section of the waveguide where the first and second arms rejoin. The RF and LO signals are applied simultaneously to the first arm of the channel waveguide, while the second arm is maintained at ground potential. The optical phase of the portion of the laser beam propagating through the first arm is changed by the RF and LO signals relative to the optical phase of the portion of the laser beam propagating through the second arm—thereby causing amplitude modulation of the recombined laser beam in the output section of the channel waveguide.

The amplitude-modulated laser beam passes from the output section of the channel waveguide of the MZM to a photodetector, which generates a corresponding photocurrent signal. The photocurrent signal contains frequency components, which include: (1) the RF frequency; (2) the LO frequency; (3) a beat frequency (i.e., the frequency difference of the RF and LO frequencies); and (4) a sum frequency (i.e., the sum of the RF and LO frequencies). Under typical operating conditions, the LO signal contains only a single frequency. The waveforms of the photocurrent signal at the RF frequency, the beat frequency and the sum frequency correspond to the waveform of the RF input signal. Typically, only the component of the photocurrent signal at the beat frequency is retained. (The components at the other frequencies are highly attenuated using bandpass filters.)

The first arm of the channel waveguide is d.c.-biased so that, when no RF and LO signals are applied thereto, the phase of the portion of the laser beam propagating through the first arm is shifted by substantially 180° with respect to the phase of the portion of the laser beam propagating through the second arm. The d.c.-bias voltage that produces this 180° phase shift is designated $V_\pi$. When the RF signal and the LO signal are applied to the first arm, the recombined laser beam in the output section of the channel waveguide has an amplitude modulation, which contains a multiplication of the RF and LO signals. The corresponding photocurrent signal at the beat frequency of the RF and LO signals has a maximum value when the MZM is operated at the $V_\pi$ bias. When, the MZM is operated at a bias voltage away from $V_\pi$, the photocurrent signal at the beat frequency of the RF and LO signals becomes weaker.

It is another object of the present invention to provide a technique for photonically mixing an information-bearing RF signal with an LO signal of specified frequency by means of two MZMs, which operate outside the linear range with matched photodetectors in order to increase sensitivity.

When two MZMs are used, each MZM functions independently of the other as a photonic mixer operating at the $V_\pi$ bias. The $V_\pi$ bias changes the phase of the portion of the CW laser beam in the first arm relative to the portion of the CW laser beam in the second arm in each of the first and second MZMs by 180°. The first MZM has a first output port that is connected to a first photodetector, and a second output port that is connected to the second MZM. The output from the first output port (i.e., the "first optical output") of the first MZM serves as the optical input to the first photodetector. The RF and LO signals can be applied simultaneously to the first arm of each of the two MZMs. However, when no RF and LO signals are applied to the first arms of the first and second MZMs, the $V_\pi$ bias causes all the energy of the CW laser beam propagating through the first MZM to exit therefrom via the second output. Thus, the optical output from the second output port (i.e., the "second optical output") of the first MZM serves as the CW laser beam that is guided to the second MZM.

When the RF signal and the LO signal are applied to the first arms of the first and second MZMs, the $V_\pi$ bias causes a portion (actually a very small fraction) of the energy of the CW laser beam propagating through the first MZM to exit therefrom via the first output port as the "first optical output". The output from the second output port of the first MZM (i.e., the "second optical output") is only slightly diminished when the RF and LO signals are applied, so that for practical purposes the energy of the CW laser beam guided into the second MZM can be considered as being substantially the same as the energy of the CW laser beam guided into the first MZM. The "first optical output" of the first MZM (i.e., the optical input to the first photodetector) exhibits an amplitude modulation, which contains a multiplication of the RF and LO signals.

In response to the amplitude-modulated "first optical output" of the first MZM, the first photodetector generates a corresponding first photocurrent signal containing a beat-frequency component, which indicates the frequency difference of the RF and LO signals. Since the second MZM is operated at the same $V_\pi$ bias as the first MZM, and since the RF and LO signals are applied to the first arms of the first and second MZMs simultaneously, a portion of the energy of the CW laser beam propagating through the second MZM exits therefrom via a first output port as the "first optical output" thereof. The "first optical output" of the second MZM exhibits the same amplitude modulation as is exhibited by the "first optical output" of the first MZM.

The amplitude-modulated output from the first output port of the second MZM is detected by a second photodetector, which generates a corresponding second photocurrent signal containing a beat-frequency component likewise indicating the frequency difference of the RF and LO signals. The first and second photocurrent signals are 180° out-of-phase with each other, because the amplitude modulation of the optical inputs to the first and second photodetectors are 180° out-of-phase with each other. The beat frequency components of the first and second photocurrent signals are combined electronically to produce a combined photocurrent signal, which is used to regenerate the information content of the RF signal.

Photocurrent noise due to intensity fluctuations in the CW laser beam propagating through the second MZM is in phase with photocurrent noise due to intensity fluctuations in the CW laser beam propagating through the first MZM. Thus, subtractively combining the beat frequency components of the first and second photocurrent signals causes cancellation of the photocurrent noise, while doubling the amplitude of the beat frequency component of the photocurrent signal that would be obtained by using just one photodetector. Consequently, a photonic mixer using two MZMs in accordance with the present invention is significantly more sensitive than a photonic mixer using just one MZM.

DESCRIPTION OF THE DRAWING

FIG. 1 is a perspective view in longitudinal cross section of a typical Mach-Zehnder modulator as known in the prior art.

FIG. 2 is a block diagram of the Mach-Zehnder modulator of FIG. 1 operating as a conventional electrical-to-optical modulator.

FIG. 3 is a graphical representation of photodetector output as a function of modulating voltage for a Mach-Zehnder modulator operating conventionally as a "high fidelity" electrical-to-optical modulator as indicated in FIGS. 1 and 2.

FIG. 4 is a graphical representation of photodetector output as a function of modulating voltage for a Mach-Zehnder modulator operating at a $V_\pi$ bias voltage according to the present invention—viz., with a bias such that a component of the photodetector output has a frequency that is double the frequency of the modulating voltage.

FIG. 5 is a schematic representation of a photonic mixer according to a first embodiment of the present invention in which a radio-frequency (RF) signal and a local oscillator (LO) signal are combined to produce an input electrical signal, which is applied to a first arm of a Mach-Zehnder modulator—where the first arm is biased to produce a 180° optical phase shift with respect to a second arm of the Mach-Zehnder modulator.

FIG. 6 is a block diagram of a photonic mixer according to a second embodiment of the present invention in which an RF signal and an LO signal are each applied directly to a first arm of a Mach-Zehnder modulator, where the first arm is biased to produce a 180° optical phase shift with respect to a second arm of the Mach-Zehnder modulator.

FIG. 7 is a schematic representation of the photonic mixer of FIG. 6.

FIG. 8 is a block diagram of a photonic mixer according to a third embodiment of the present invention in which an RF signal and an LO signal are combined to produce an input electrical signal that is applied to the first arms of each of two optically connected MZMs, where a first optical output of a first one of the MZMs serves as the optical input for a second one of the MZMs, where the first arm of each MZM is biased to produce a 180° optical phase shift with respect to the second arm thereof, and where a second optical output of the first MZM and an optical output of the second MZM serve as corresponding inputs to two matched photodetectors which recover the information content of the RF signal.

FIG. 9 is a schematic representation of the photonic mixer of FIG. 8.

BEST MODE OF CARRYING OUT THE INVENTION

In FIG. 1, functional features of a typical Mach-Zehnder modulator (MZM) 10 as known in the prior art are illustrated. MZMs are commercially marketed by a number of suppliers, including, e.g., Crystal Technology in Palo Alto, Calif.; United Technologies Photonics in Hartford, Conn.; and GCE Advanced Optical Products Ltd. in Chelmsford, Essex, England.

The MZM 10 shown in FIG. 1 comprises an elongate substrate 11 in which a channel waveguide is formed. The substrate 11 could be made of, e.g., gallium arsenide or lithium niobate. An input section 12 of the channel waveguide receives a continuous wave (CW) laser beam for propagation through the MZM 10. At a first Y-junction on one side of a mid-way position along the substrate 11, the channel waveguide branches into a first arm 13 and a second arm 14. The arms 13 and 14 extend parallel to each other, and rejoin at a second Y-junction on the other side of the mid-way position along the substrate 11 to form an output section 15 of the channel waveguide. The laser beam, which is of constant power, is generated by a conventional laser device 20, and is guided into the input section 12 of the channel waveguide by conventional means (e.g., an optical fiber). The laser beam splits at the first Y-junction into a first portion that propagates through the first arm 13, and a second portion that propagates through the second arm 14.

A first metallic electrode 21 is formed (as by vapor deposition) on a surface portion of the substrate 11 over the first arm 13; and a second metallic electrode 22 is formed in like manner on a surface portion of the substrate 11 over the second arm 14. The first electrode 21 is connected by a conductor 23 to an electrical signal input pin 24. The second electrode 22 is connected by a conductor 25 to a metallic casing 26, which serves as an electrical ground or is itself electrically grounded. In the particular embodiment illustrated in FIG. 1, the casing 26 encloses (or forms part of an enclosure around) the MZM 10. The input pin 24 extends out through the casing 26 to receive an information-bearing electrical signal applied thereto. Opposite ends of the elongate substrate 11 extend out through the casing 26 to function as input and output ports for the laser beam that is propagated through the channel waveguide.

An information-bearing electrical signal—which is typically a radiofrequency (RF) signal—is applied to the input pin 24 (and thus to the first electrode 21). The RF signal causes a change in the index of refraction of the material comprising the first arm 13 of the channel waveguide, and thereby produces a change-of-phase of the first portion of the laser beam that is being propagated through the first arm 13 relative to the second portion of the laser beam that is being propagated through the second arm 14. The first and second portions of the laser beam are then combined in the optical output section 15 of the channel waveguide to form an optical output signal, which is conveyed (typically by means of an optical fiber) as an input optical signal to a photodetector 30.

A block diagram illustrating the functional components of the MZM 10 is shown in FIG. 2. The optical output signal from the MZM 10 is an amplitude-modulated signal with carriers at optical frequencies. The photodetector 30 detects this amplitude-modulated optical signal, and generates a corresponding electrical output signal (i.e., a photocurrent signal)—which has a waveform determined by the RF signal applied to the pin 24. In conventional operation (i.e., where the MZM 10 functions as an electrical-to-optical modulator), the first arm 13 of the channel waveguide is d.c.-biased so that the resulting photocurrent signal generated by the photodetector 30 has a waveform that is substantially the same (except for amplitude and a fixed phase shift) as the waveform of the RF signal—i.e., so that the photodetector 30 produces a "high fidelity" electrical output signal that retains all the significant information contained in the RF signal.

FIG. 3 includes a plot indicating variation of the photocurrent signal generated by the photodetector 30 as a function of voltage of the RF signal applied to the input pin 24 of the MZM 10. The variation is sinusoidal with a frequency that is determined by the frequency of the applied RF signal. To achieve a "high fidelity" photocurrent signal from the photodetector 30, the MZM 10 must be biased so that the applied RF signal has maximum and minimum amplitude values within a substantially linear region on the sinusoidal curve indicating the variation of the photocurrent signal with respect to the applied RF signal. As shown in FIG. 3, the frequency of the photocurrent signal is equal to the frequency of the applied RF signal when the MZM 10 is operated in this linear operating region.

FIG. 4 likewise includes a plot indicating variation of the photocurrent signal generated by the photodetector 30 as function of voltage of the RF signal applied to the input pin 24 of the MZM 10. As in FIG. 3, the variation is sinusoidal with a frequency that is determined by the frequency of the applied RF signal. However, FIG. 4 shows the waveform of the photocurrent signal generated by the photodetector 30 when the MZM 10 is biased so that the applied RF signal is centered in a nonlinear operating region of the MZM 10—viz., in a region centered on an applied voltage value $V_\pi$ for which the optical input signal to the photodetector 30 is zero.

As indicated in FIG. 4, when the MZM 10 is biased to operate at $V_\pi$, the photocurrent signal generated by the photodetector 30 has a d.c. component (i.e., the average value of the photocurrent signal) and an a.c. component. The a.c. component of the photocurrent signal has a frequency that is double the frequency of the applied RF signal. The value of the d.c. component, and the amplitude of the a.c. component at double the frequency of the RF signal, are proportional to the square of the amplitude of the applied RF signal.

The MZM 10 is not conventionally operated outside the linear region indicated in FIG. 3, because it is ordinarily desired that the photocurrent signal generated by the photodetector 30 be a "high fidelity" signal with only negligible low-power harmonics. However, in accordance with the present invention, the MZM 10 is operated in a nonlinear region (preferably, a region centered on the voltage $V_\pi$) in order to obtain a photocurrent signal consisting predominantly of second-order harmonics of the applied RF signal.

When the electrical signal applied to the input pin 24 of the MZM 10 is a combined RF signal and local oscillator (LO) signal, where the LO signal has a specified constant frequency and amplitude, the photocurrent signal generated by the photodetector 30 contains a component at the beat frequency (i.e., the frequency difference of the RF and LO frequencies), and a component at the sum frequency of the RF and LO frequencies. Typically, the beat frequency is lower (usually very much lower) than the frequency of the applied RF signal. Thus, the component of the photocurrent signal at the beat frequency is usually much more amenable to signal processing than is the RF signal. The waveform of the component of the photocurrent signal at the beat frequency is substantially the same as the waveform of the RF signal. Hence, the information content of the RF signal can be extracted with "high fidelity" from the component of the photocurrent signal at the beat frequency.

FIG. 5 schematically indicates a way of combining the RF and LO signals into a combined signal, which can be applied to the input pin 24 of the MZM 10. As illustrated in FIG. 5, the RF and LO signals are inputs to a conventional RF combiner, which generates an electrical output signal that contains the RF and LO signals as components thereof. The electrical output signal from the RF combiner is then applied to the input pin 24 (and thus to the first electrode 21 adjacent the first arm 13) of the MZM 10.

FIG. 6 shows an alternative way of applying the RF and LO signals to the first arm 13 of the channel waveguide. An additional metallic electrode 31 (i.e., in addition to the electrode 21) is formed on a corresponding portion of the substrate 11 over the first arm 13. The electrode 31 is connected by a corresponding conductor to a corresponding input pin to which the LO signal is applied. The RF signal is applied via a separate input pin (i.e., the input pin 24) to the electrode 21. The embodiment of the invention as illustrated in FIG. 6 does not require an RF combiner, and hence avoids the signal loss inherent in using an RF combiner. Thus, the embodiment illustrated in FIG. 6 has a lower noise figure than the embodiment illustrated in FIG. 5, and is recommended for use particularly in applications involving weak RF signals.

FIG. 7 provides a schematic illustration of the photonic mixer of FIG. 6.

FIG. 8 shows an alternative embodiment of the present invention in which two MZMs 10 and 10' are used. The first MZM 10 has two optical outputs. The second MZM 10' needs only one optical output to function in accordance with the invention, but may have two optical outputs. As illustrated in FIG. 8, the CW laser beam generated by the laser device 20 is guided (as by a conventional optical fiber) into the input section 12 of the channel waveguide formed in the substrate 11 of the first MZM 10. The input section 12 branches into the two arms 13 and 14, which rejoin to form the output section 15. The output section 15 of the channel waveguide then branches into two output arms 16 and 17, which lead to two corresponding optical output ports.

A first optical output from the first MZM 10 is guided (as by a conventional optical fiber) from the output arm 16 to the first photodetector 30. A second optical output from the first MZM 10 is guided (as by a conventional optical fiber) from the output arm 17 to an input section 12' of a channel waveguide formed in a substrate 11' of the second MZM 10'. The input section 12' of the channel waveguide of the second MZM 10' branches into a first arm 13' and a second arm 14', just as the input section 12 of the channel waveguide of the first MZM 10 branches into the arms 13 and 14. Electrodes 21' and 22' are formed over the arms 13' and 14', respectively, of the channel waveguide of the second MZM 10', just as the electrodes 21 and 22 are formed over the arms 13 and 14, respectively, of the channel waveguide of the first MZM 10. The arms 13' and 14' rejoin to form an output section 15', which then branches into two output arms 16' and 17' leading to two corresponding optical output ports of the second MZM 10'.

An RF signal and an LO signal can be applied simultaneously by means of a conventional coupler 35 to the electrode 21 positioned over the first arm 13 of the waveguide of the first MZM 10, and to the electrode 21' positioned over the first arm 13' of the waveguide of the second MZM 10'. The electrodes 22 and 22' are both grounded. The first MZM 10 is operated at a bias of $V_\pi$ so that the portion of the CW laser beam propagating through the first arm 13 undergoes a phase change 180° relative to the portion of the CW laser beam propagating through the second arm 14. Similarly, the second MZM 10' is operated at the same $V_\pi$ bias so that the portion of the CW laser beam propagating through the first arm 13' undergoes a phase change 180° relative to the portion of the CW laser beam propagating through the second arm 14'.

As illustrated in FIG. 8, only the optical output exiting through the output arm 16' of the second MZM 10' is utilized for purposes of the invention. The optical output exiting through the output arm 17' can be guided to an energy absorbing device, or can be used to provide an optical input to a second photonic mixer. Alternatively, the second MZM 10' with two output arms 16' and 17' as illustrated in FIG. 8 could be replaced by an MZM with only one output arm as illustrated in FIG. 2. The photonic mixer with two MZMs as illustrated in FIG. 8 could be fabricated on a single chip.

When no RF and LO signals are applied to the electrodes 21 and 21', the optical output exiting through the output arm 16 of the first MZM 10 is zero, and all the energy of the CW laser beam exits from the first MZM 10 via the output arm 17; and likewise, the optical output exiting through the output arm 16' of the second MZM 10' is zero, and all the energy of the CW laser beam exits from the second MZM 10' via the output arm 17'. The CW laser beam exiting from the second MZM 10' can be guided to an appropriate energy absorbing device, or can be utilized as an optical input to another photonic mixer or other type of optical device depending upon the particular application.

When the RF and LO signals are applied to each of the electrodes 21 and 21', the portions of the CW laser beams propagating through the first arms 13 and 13' undergo a.c. phase changes, which produce amplitude-modulated output signals at the output arms 16 and 16' of the MZMs 10 and 10', respectively. The output signal from the output arm 16 of the first MZM 10 is detected by the first photodetector 30, and the output signal from the output arm 16' of the second MZM 10' is detected by a second photodetector 40. The first and second photodetectors 30 and 40 are "matched"—i.e., they have the same electrical and electro-optical characteristics.

The matched photodetectors 30 and 40 generate corresponding photocurrent signals, each of which contains a beat frequency component indicating the frequency difference between the RF signal and the LO signal. Since the LO signal has a specified constant frequency and amplitude, the beat frequency components of the corresponding photocurrent signals generated by the photodetectors 30 and 40 have the same waveform as the RF signal (except for amplitude and a fixed phase shift). Since the amplitude modulations of the optical output signals from the output arms 16 and 16' of the MZMs 10 and 10' are 180° out-of-phase with each other, the waveforms of the beat frequency components of the corresponding photocurrent signals generated by the photodetectors 30 and 40 are identical to each other but are out-of-phase by 180°.

Photocurrent noise attributable to intensity fluctuations of the optical input to the first photodetector 30 is in phase with photocurrent noise attributable to intensity fluctuations of the optical input to the second photodetector 40. Therefore, by subtractively combining the beat frequency components of the photocurrent signals generated by the photodetectors 30 and 40, a net beat frequency photocurrent signal is obtained in which: (1) the amplitude is double the amplitude of the beat frequency component of the photocurrent signal generated by a single one of the photodetectors 30 and 40; and (2) the noise attributable to intensity fluctuations in one effectively cancels the noise attributable to intensity fluctuations in the other of the matched photodetectors 30 and 40.

The use of two optically connected MZMs with corresponding matched photodetectors (e.g., the MZMs 10 and 10' and the corresponding matched photodetectors 30 and 40 as illustrated in FIG. 8) to generate two photocurrent signals provides greater sensitivity and has a higher signal to noise ratio than the use of only a single MZM and a single photodetector, because the noise is significantly lower when two MZMs are used. For an application in which the RF signal is so weak that noise attributable to intensity fluctuations in the CW laser beam is apt to mask the information content of the RF signal, an embodiment using two MZMs with matched photodetectors is recommended.

FIG. 9 provides a schematic illustration of the photonic mixer of FIG. 8.

The present invention has been described above in terms of particular embodiments. However, other embodiments (utilizing, e.g., other types of interferometric modulators) would become apparent to practitioners skilled in the art upon perusal of the foregoing specification and the accompanying drawing. For example, the MZM 10 (and/or the MZM 10') need not be of a type that splits the CW laser beam into spatially separated portions that propagate through parallel arms as illustrated in the drawing. Instead, in another alternative embodiment of the invention, the CW laser beam could be mathematically considered as containing two superimposed linearly cross-polarized beams. The RF and LO signals would be applied to just one of the superimposed beams; and both of the superimposed beams would then be guided either to a polarizer (which produces a single optical output) or to a polarization beam splitter (which can produce two optical outputs). Also, a bias voltage that produces a 0° phase shift rather than a 180° phase shift could be used.

The particular embodiments disclosed in the foregoing specification and accompanying drawing are to be understood as merely illustrative of the invention, which is more generally defined by the following claims and their equivalents.

We claim:

1. An apparatus for photonically multiplying a first electrical signal and a second electrical signal in two optically interconnected interferometric means operated at modulation outside the linear range and for producing a net output signal which is more sensitive and has a higher signal to noise ratio than the output signal which can be produced by either interferometric means alone, said apparatus comprising:
   a) laser means for generating a laser beam;
   b) first interferometric means comprising:
      (i) first separating means for separating said laser beam into a first component and a second component;
      (ii) first applying means for applying said first and second electrical signals and a biasing voltage to said first component of said laser beam so as to produce a phase difference between said first component and said second component of said laser beam and modulation outside the linear range;
      (iii) first recombining means for recombining said first and second components of said laser beam into an optical output beam; and
      (iv) first splitting means for splitting said recombined optical output beam into a first optical output beam component and a second optical output beam component from said first interferometric means;
   c) first photodetector means responsive to said first optical output beam component from said first interferometric means, said first photodetector means generating a first photocurrent signal, said first photocurrent signal containing a component having a waveform corresponding to a multiplication of said first and second electrical signals;
   d) second interferometric means,
   e) guiding means for guiding said second optical output beam component from said first interferometric means into said second interferometric means,
   said second interferometric means comprising:
      (i) second separating means for separating said second optical output beam component from said first interferometric means into a first part and a second part;
      (ii) second applying means for applying said first and second electrical signals and biasing voltage to said first part of said second optical output beam component from said first interferometric means so as to produce a phase difference between said first part and said second part of said second optical output beam component and modulation outside the linear range; and
      (iii) second recombining means for recombining said first and second parts of said second optical output beam component from said first interferometric means into a third optical output beam component;
   f) second photodetector means responsive to said third optical output beam component from said second interferometric means, said second photodetector means generating a second photocurrent signal, said second photocurrent signal containing a component likewise having a waveform corresponding to a multiplication of said first and second electrical signals; and
   g) photocurrent signal combining means for combining said components of said first and second photocurrent signals containing said waveforms corresponding to the multiplication of said first and second electrical signals and for producing a net photocurrent signal output which is more sensitive and has a higher signal to noise ratio than either of the first and second photocurrent signals.

2. The apparatus of claim 1 wherein each of said first and second photodetector means functions so that each of said first and second photocurrent signals contains:
   a) a component having a waveform corresponding to said first electrical signal,
   b) a component having a waveform corresponding to said second electrical signal,
   c) a beat frequency component, and
   d) a sum frequency component,
each of said beat frequency and sum frequency components of said first and second photocurrent signals having a waveform that is substantially identical to the waveform for said first electrical signal except for amplitude and a fixed phase shift.

3. The apparatus of claim 2 wherein each of said first and second photodetector means functions so that a specified one of said beat frequency component and said sum frequency component of said each of first and second photocurrent signals is presented as the multiplication of said first and second electrical signals.

4. The apparatus of claim 3 wherein said first electrical signal is a radiofrequency signal, said second electrical signal is a local oscillator signal, and the beat frequency components of said first and second photocurrent signals are subtractively combined.

5. The apparatus of claim 4 wherein the radiofrequency signal is centered on the biasing voltage so as to produce a photocurrent signal having a frequency double the frequency of the modulating radio frequency signal.

6. The apparatus of claim 5 wherein the biasing voltage produces a phase difference which is substantially 180 degrees.

7. The apparatus of claim 1 wherein said first and second photodetector means have substantially identical electrical and electro-optical characteristics so that the subtractive combination of said first and second photocurrent signals produces said net photocurrent signal that is more sensitive and has a higher signal to noise ratio than either of said first and second photocurrent signals.

* * * * *